United States Patent [19]
Seidel et al.

[11] Patent Number: 5,337,255
[45] Date of Patent: Aug. 9, 1994

[54] METHOD FOR IMPLEMENTING SET/RESET SYNCHRONOUSLY OR ASYNCHRONOUSLY IN A PROGRAMMABLE LOGIC DEVICE

[75] Inventors: Jorge P. Seidel, San Jose; Arun K. Mandhania, Milpitas, both of Calif.

[73] Assignee: Xilinx, Inc., San Jose, Calif.

[21] Appl. No.: 787,343

[22] Filed: Oct. 30, 1991

[51] Int. Cl.⁵ ............................................. G06F 15/60
[52] U.S. Cl. .................................. 364/489; 364/488; 364/491
[58] Field of Search ............... 364/488, 489, 490, 491, 364/716; 340/825.83; 307/465

[56] References Cited

U.S. PATENT DOCUMENTS

| | | | |
|---|---|---|---|
| 4,700,187 | 10/1987 | Furtek | 340/825.83 |
| 4,845,633 | 7/1989 | Furtek | 364/490 |
| 4,922,432 | 5/1990 | Kobayashi et al. | 364/490 |
| 4,964,056 | 10/1990 | Bekki et al. | 364/488 |
| 5,031,111 | 7/1991 | Chao et al. | 364/491 |
| 5,097,422 | 3/1992 | Corbin, II et al. | 364/491 |
| 5,126,950 | 6/1992 | Rees et al. | 364/490 |
| 5,210,701 | 5/1993 | Hana et al. | 364/491 |

*Primary Examiner*—Thomas G. Black
*Assistant Examiner*—Jr. Walden
*Attorney, Agent, or Firm*—Edel M. Young

[57] ABSTRACT

A method is disclosed for allowing a user to enter a register symbol in a schematic diagram and attach to the register symbol both asynchronous and synchronous reset inputs. The method further provides for automatically generating an equivalent circuit from the register symbol. In one embodiment, the user may also specify a constant value (including don't are values) to be returned in response to the reset signal. In a preferred embodiment the user may specify values to be returned in response to both asynchronous and synchronous reset signals. In a preferred embodiment the user can specify a prioritized list of values for the synchronous reset control.

14 Claims, 13 Drawing Sheets

VALUE OUT AFTER NEXT CLOCK PULSE

| S[2] | S[1] | S[0] | Q3 | Q2 | Q1 | Q0 |
|------|------|------|----|----|----|----|
| 0 | 0 | 0 | D3 | D2 | D1 | D0 |
| 0 | 0 | 1 | D3 | D2 | 1 | 0 |
| 0 | 1 | 0 | 0 | 1 | D1 | D0 |
| 0 | 1 | 1 | 0 | 1 | 0 | 1 |
| 1 | 0 | 0 | 1 | 1 | 1 | 1 |
| 1 | 0 | 1 | 1 | 1 | 1 | 0 |
| 1 | 1 | 0 | 0 | 1 | 1 | 1 |
| 1 | 1 | 1 | 0 | 1 | 0 | 1 |

FIG. 13

METHOD FOR IMPLEMENTING SET/RESET SYNCHRONOUSLY OR ASYNCHRONOUSLY IN A PROGRAMMABLE LOGIC DEVICE

FIELD OF THE INVENTION

The invention relates to computer aided design and engineering, more particularly to implementing a logic design in a programmable logic device.

RELATED APPLICATIONS

The present invention relates to inventions described in the following copending (concurrently filed) patent applications, all of which are incorporated herein by reference:

1. Steven H. Kelem and Steven K. Knapp, METHOD FOR PROPAGATING DATA TYPE IN A HIGH LEVEL BLOCK DIAGRAM, U.S. patent application Ser. No. 07/785,664 still pending.
2. Jorge P. Seidel and Steven K. Knapp, METHOD FOR OPTIMIZING RESOURCE ALLOCATION STARTING FROM A HIGH LEVEL BLOCK DIAGRAM, U.S. patent application Ser. No. 07/784,842 still pending.
3. Jorge P. Seidel, Steven K. Knapp, Steven H. Kelem, METHOD FOR GENERATING LOGIC MODULES FROM A HIGH LEVEL BLOCK DIAGRAM, U.S. patent application Ser. No. 07/785,659, still pending.

BACKGROUND OF THE INVENTION

When a designer creates a logic design, a frequently used function which the designer intends to include is a flip flop with a set/reset function. Typically the designer will include in the design the circuitry necessary to set or reset multiple flip flops in response to a command to set or reset the system. It is often desirable to have some flip flops return to a specified state asynchronously, that is, as soon as a set or reset command is generated, and to have other flip flops return to a specified state synchronously, that is, upon receiving a clock signal after a set or reset command has been sent. Further, it is often desirable to have some flip flops respond to a set signal (assume a logical 1 state) and other flip flops to respond to a reset signal (assume a logical 0 state).

When designing a circuit with the aid of a computer, a user calls up symbols from a symbol library and places these symbols in view on a computer monitor. The user then interconnects the symbols to form a schematic diagram. In the past, a designer was required to develop a schematic diagram from primitive logic symbols such as AND, OR, and flip flop. If the user was designing a bus-wide function, the logic would have to be entered multiple times for the multiple lines in the bus.

Regarding the reset function in particular, users frequently wish to provide both synchronous and asynchronous set and reset control of flip flops. The asynchronous set or reset is provided as part of a standard D flip flop and can therefore be used directly by the designer. To form a synchronous set or reset for a flip flop, it was necessary to design and show the specific gates which would generate the necessary logic.

In either case, the process of designing the necessary circuitry to handle the set/reset functions is tedious, especially if the functions to be handled are bus-wide and if it is desirable to have a complex combination of set/reset and asynchronous/synchronous controls of different bits in different parts of the circuit design. Users prefer to do their designing at a higher level, thinking in terms of registers rather than flip flops, and to avoid the tedious attention to detail which has been required in the past.

SUMMARY OF THE INVENTION

According to the present invention, a method is provided for allowing a user to automatically and conveniently select whether a high level function including a flip flop will respond to a set or a reset signal or both, and to select whether the response will be synchronous or asynchronous. As another feature of the invention, a high level function which includes a register (a register is an ordered set of flip flops) can be loaded with arbitrary initial values, not just all 1's or all 0's in response to either asynchronous or synchronous set or reset commands. As another feature, multiple values can be loaded based on a prioritized initialization scheme.

In a preferred embodiment (of which further description is provided in the copending patent applications incorporated herein by reference), a designer can generate a design to be implemented by a field programmable gate array integrated circuit chip using high level symbols. Some of these high level symbols include a flip flop, a synchronous device which can be set or reset to provide an initial output value of one or zero, respectively. These synchronous symbols include a register symbol, a shift register symbol, an accumulator, a counter, and a clock-divider, for example. According to the present invention, these symbols, which the designer can call from a library, have nodes to which asynchronous and synchronous control signals can be attached. The synchronous node on the symbol indicates that synchronous reset will be available as a command. In a preferred embodiment available in the Xilinx 4500 series architecture, (for further description of the Xilinx 4500 series architecture see the Xilinx, Inc. Technical Data Book entitled XC 4000 Logic Cell(TM) Array Family, ©1990 by Xilinx, Inc. available from Xilinx, Inc., 2100 Logic Drive, San Jose, Calif. 95124) asynchronous control is always available, either as a user specified signal or in the global set-reset line which is part of the 4500 architecture. These symbols further include means for entry of a value to be loaded upon receipt of an asynchronous control signal and means for entry of another value to be loaded upon receipt of a synchronous control signal. Each value may be a conventional SET (all 1's), a conventional RESET (all 0's), or a constant value (mix of 0's and 1's as specified by the designer). Thus the designer may conveniently have access to circuitry to implement either the SET, RESET, or a mixture of these functions, and may select whether they will be implemented synchronously or asynchronously without having to manually specify the necessary circuitry to accomplish a complex combination.

A user may want to SET or RESET a particular flip flop, either synchronously or asynchronously, but independently of other SET and RESET functions on the chip. In this case, a flip flop is designated which is to be controlled separately through a line other than those provided by the preferred architecture for the particular purpose.

When doing a synchronous reset, the user may want only a subset of a register re-initialized and may not care about the states of other bits. In one preferred embodiment, for the synchronous value only, either "*" or "?" is used to specify 'don't care' bits. Don't care bits will not be configured to have the logic for synchronous control, thereby saving chip area. A user may also have a sequence of values that need to be loaded synchronously, or may wish to load different values under different conditions. In a preferred embodiment, if the synchronous control signal is a bus, separate synchronous control signals can be sent on each line of the bus. The bus lines are prioritized with the least significant bit of the control bus having the highest priority.

BRIEF DESCRIPTION OF THE DRAWINGS

FIG. 13 shows the output values provided by the circuit of FIG. 11 upon the next clock pulse in response to each possible combination of synch reset signals.

DETAILED DESCRIPTION OF A PREFERRED EMBODIMENT WITH SEVERAL EXAMPLES

Figure 1A:
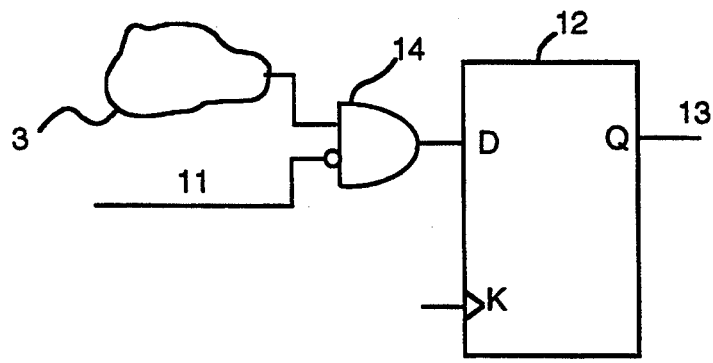
FIGS. 1A-1D show four possible set/reset options offered by the method of the present invention.
Figure 1B:
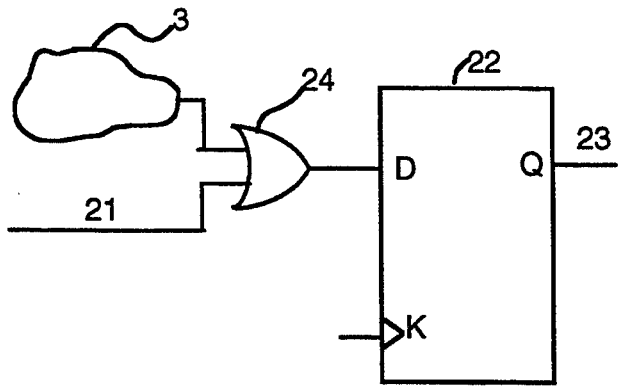
Figure 1C:
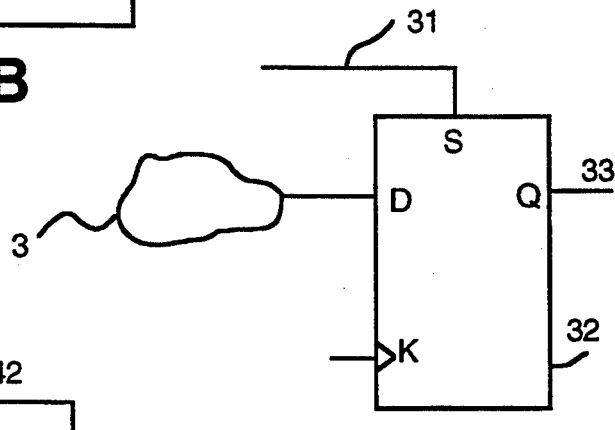
Figure 1D:
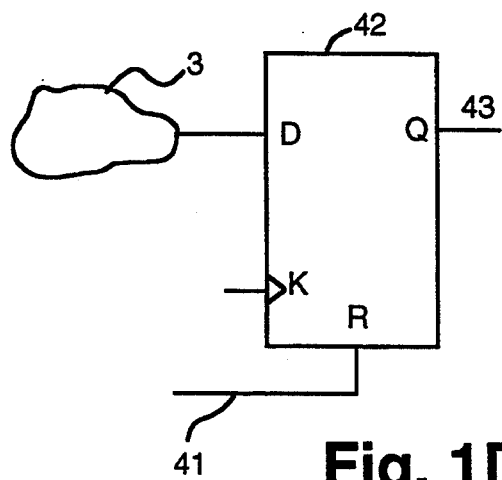

As is well known, D-type flip flops provide a synchronous output Q of the D input in response to either the rising or the falling edge of a clock signal. Set and reset signals on a D flip flop cause instant asynchronous logical one and logical zero responses, respectively, at the Q output. According to the present invention, additional options are provided for synchronous set and reset. FIGS. 1A-1D show the four modes which result. FIGS. 1A and 1B are synchronous, and FIGS. 1C and 1D are asynchronous.

FIG. 1A shows the synchronous reset mode. In a normal (not reset) mode of operation, reset line 11 carries a logical 0 signal, which sends a high signal to AND gate 14, causing AND gate 14 to pass the signal generated by logic 3 on to D flip flop 12. At the next rising (or falling) edge of a clock signal K, the D input is passed to the Q output of flip flop 12. Upon application of a high signal to line 11, AND gate 14 provides a logic zero signal to input D of flip flop 12 regardless of the signal from the designer's logic 3. This logical 0 signal on input D results in a Q output 13 of logical 0 upon the next rising (or falling) edge of clock signal K. Thus the circuit of FIG. 1A provides a synchronous reset of flip flop 12.

Likewise, FIG. 1B shows a synchronous set mode. In a normal mode, set line 21 carries a logical 0 signal. The logical 0 signal allows OR gate 24 to pass the designer's logic 3 to the D input of flip flop 22, which upon the next rising edge of clock signal K passes the designer's logic signal to Q output 23. In a set mode, a logical 1 signal on set line 21 causes OR gate 24 to pass a logical 1 to the D input of flip flop 22 upon the next rising edge of clock signal K regardless of the designer's logic 3. Thus the circuit of FIG. 1B provides a synchronous set of flip flop 22.

Alternatively, FIG. 1C represents an asynchronous set circuit. A logical 0 signal to the set input S of flip flop 32 allows the signal which was present on the D input at the last rising edge of clock signal K to remain on the Q output 33. However, a logical 1 signal to set input S of flip flop 32 causes a logical 1 to be immediately passed to the Q output without waiting for a rising edge of clock K. Thus the circuit of FIG. 1C is an asynchronous set circuit.

Similarly, FIG. 1D shows a D flip flop 42 with a reset input. When line 41 carries logical 0, the D input at the last rising edge of K remains on Q output line 43, whereas a logical 1 reset signal on line 41 is immediately transferred to Q output line 43. Thus FIG. 1D represents an asynchronous reset circuit.

Conversion to Circuit from Logic Symbol Design Entry

The method of the present invention allows a designer to specify each of these functions easily and automatically, and allows the designer to specify a register (a set of flip flops) in which both synchronous and asynchronous reset values can be entered.

Figure 2:
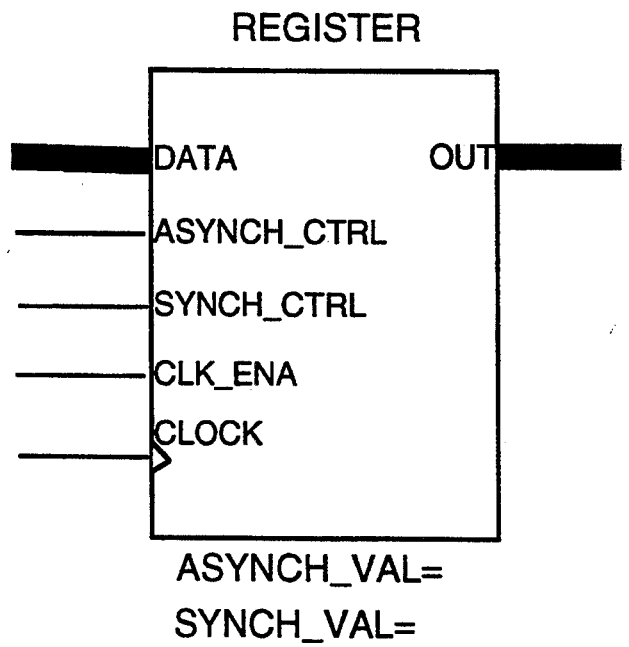
FIG. 2 shows a register symbol used with the method of the present invention.

FIG. 2 shows a symbol which is provided in a library of high level symbols for use with a preferred embodiment of the present invention. The register symbol includes a DATA input node for being connected to a bus, and an OUT node for providing input to another bus. It also includes nodes for being connected to a clock line (CLOCK) and an enable line (CLK_ENA). As can be seen in FIG. 2, the register symbol further includes inputs for both asynchronous and synchronous control signals. Also provided with the register library symbol of FIG. 2 are means for a designer to insert an asynchronous reset value and a synchronous reset value.

Figure 3:
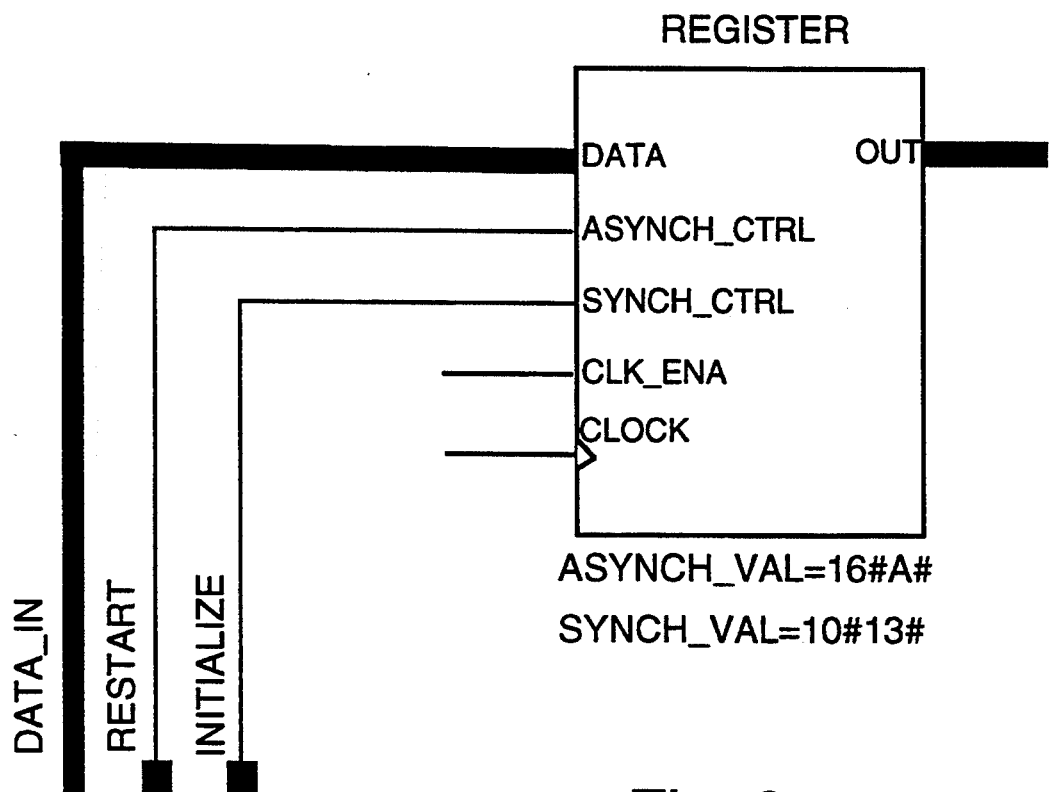
FIG. 3 shows an example use of the register symbol of FIG. 2 to implement a four-bit data register with both synchronous and asynchronous set/reset constants.

FIG. 3 shows an example use of the symbol of FIG. 2. When the symbol is called up into a block diagram by the user, if the user intends to use the set or reset functions, the user will add to the block diagram a control line connecting to the symbol. This line will be named and will be the source of the name attached to the symbol. Thus in FIG. 3, the name "RESTART" applies to the line which the user attached to the asynchronous control node of the symbol. The name "INITIALIZE" applies to the line which the user attached to the synchronous control node of the symbol. Two parameters are added to the symbol of FIG. 2 by the designer, one stating the set/reset value for the synchronous control signal and one stating the set/reset value for the asynchronous control signal. The signals attached to the control node establish a synchronous set/reset signal named "INITIALIZE" and an asynchronous reset signal named "RESTART". The parameters for the symbol, to be entered in response to the synchronous and asynchronous signals are also established. The asynchronous value is 16#A#. The first number 16 is interpreted to represent the number base and the second value A (which is binary 1010) is the base-16 number to be placed on the register output in response to an asynchronous reset signal. The synchronous value is 10#13#, which indicates that the number in base 10 to be placed on the register output in response to a clock signal is 13 (binary 1101). In a preferred embodiment, any number base can be used.

Of course, it is also possible, and more common, to load all binary 1's as a set value or all 0's as a reset value. The loading of all 1's can be specified by entering 16#F# or 10#15#, or alternatively by entering "SET". Likewise, the loading of all zeroes can be specified by entering 16#0#, 10#0#, or "RESET". The commands "SET" and "RESET" allow the user to specify a value that is independent of the width of the register array. They are also more intuitively understood by a novice user.

Figure 4:
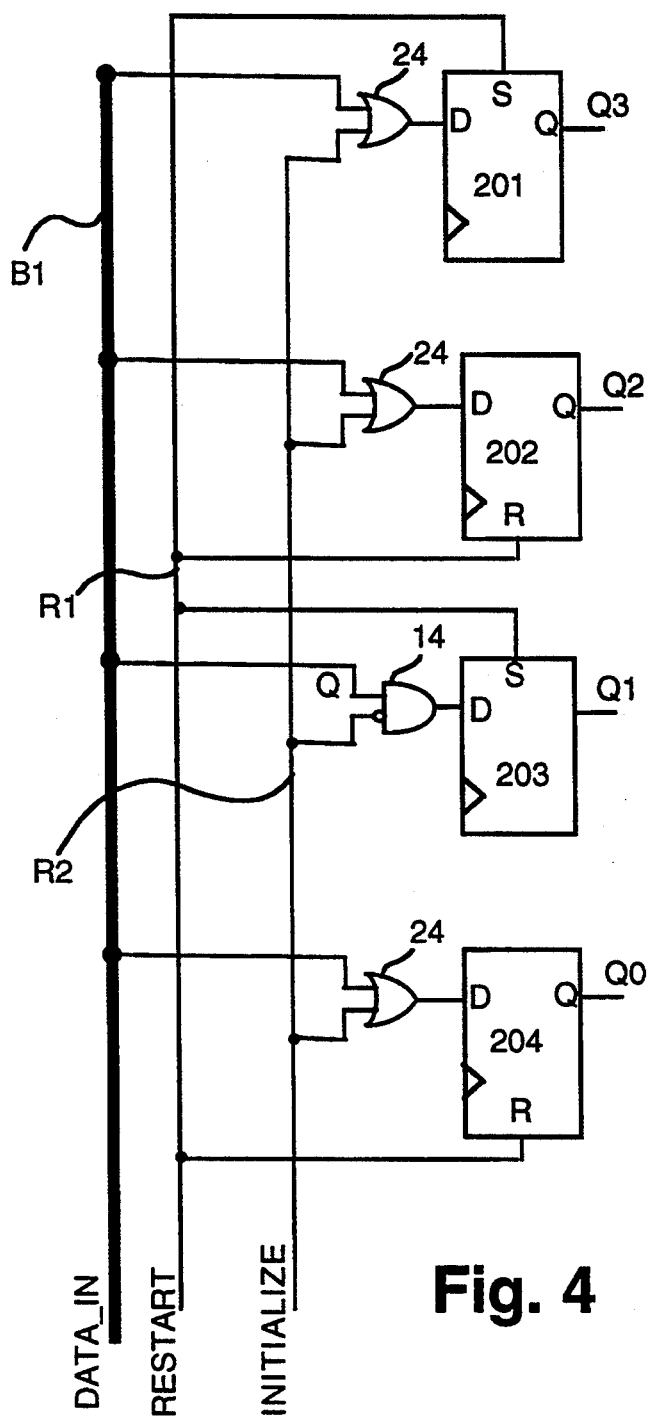
FIG. 4 shows the circuit which implements FIG. 3 as a data register.

FIG. 4 shows the circuit which will implement the symbol and parameters of FIG. 3. The circuit of FIG. 4 is configured automatically in response to entry of the logic symbol of FIG. 3 with its parameters. Four D-type flip flops 201-204 are provided, each of which generates a single-bit output of a four-bit register. The four flip flops are arranged with ordered outputs Q0 through Q3. A bus B1 of width 4 is provided. The bus width can be specified by the designer, or can be propagated to bus B1 by a propagation algorithm which receives data from a designer about other portions of the circuit and propagates information including bus width to buses such as B1. The register width is selected automatically to correspond to the bus width. The bus width of bus B1 and the register width are preferably determined by means discussed in U.S. patent application Ser. No. 07/785,664 still pending which has been incorporated herein by reference.

Because the designer specified both synchronous and asynchronous set/reset controls in the example of FIG. 3, lines R1 and R2 are provided to carry the two signals. Line R1 carries the asynchronous set/reset signal. The signal on line R1 is distributed to the D flip flops, which implement the R1 signal as a combination of set and reset flip flops based on the given asynchronous value "A", or binary 1010. The S symbol on flip flops 201 and 203 indicates that these flip flops are configured to provide a logical 1 output in response to a high signal on line R1. The R symbol on flip flops 202 and 204 indicates that these flip flops are configured to provide a logical 0 output in response to a high signal on line R1. Thus a high signal on line R1 will cause the register comprising flip flops 201-204 to provide the output signal 1010 or hex A.

Line R2 carries the synchronous set/reset signal. This is implemented as a combination of logical AND and OR gates. The INITIALIZE signal on line R2 is logically combined at the D input with the data from bus B1 so that it is not implemented until receipt of a clock edge. Flip flops 201, 202, and 204 implement a synchronous set, since OR gates 24 provide logical 1 in response to a logical 1 INITIALIZE signal on line R2 regardless of the values on bus B1. Flip flop 203 provides a synchronous reset since a logical 0 is provided to the D input of flip flop 203 in response to a high signal on INITIALIZE line R2 regardless of the signal on its line from bus B1. Thus the INITIALIZE signal produces a synchronous set/reset value of 1101 or number 13 on outputs Q0–Q3 upon the next clock edge after the high INITIALIZE signal on line R2 is applied. Thus the circuit of FIG. 4 is configured to respond to the designer's symbol and parameters as entered in FIG. 3.

The library symbol of FIG. 2, for which an example implementation has been shown in FIGS. 3 and 4, is preferably one from a library of such high level symbols. The library preferably includes other high level logic symbols such as adder, comparator, multiplexer, all of which can be used to generate parts of a schematic diagram, and all of which cause a computer program to generate instructions specific for a particular programmable device to cause the device to implement the high level function in a manner optimal for the particular programmable device. Some of the nodes may be left unconnected. The Set/Reset function with asynchronous and synchronous controls may be provided on other high level block diagrams besides a register. Any function which includes storage elements can include the Set/Reset method of the invention. Accumulators are another example. Memory cells are another. For further explanation of the implementation of other library symbols, see copending U.S. patent application Ser. No. 07/785,659 still pending.

Figure 5:
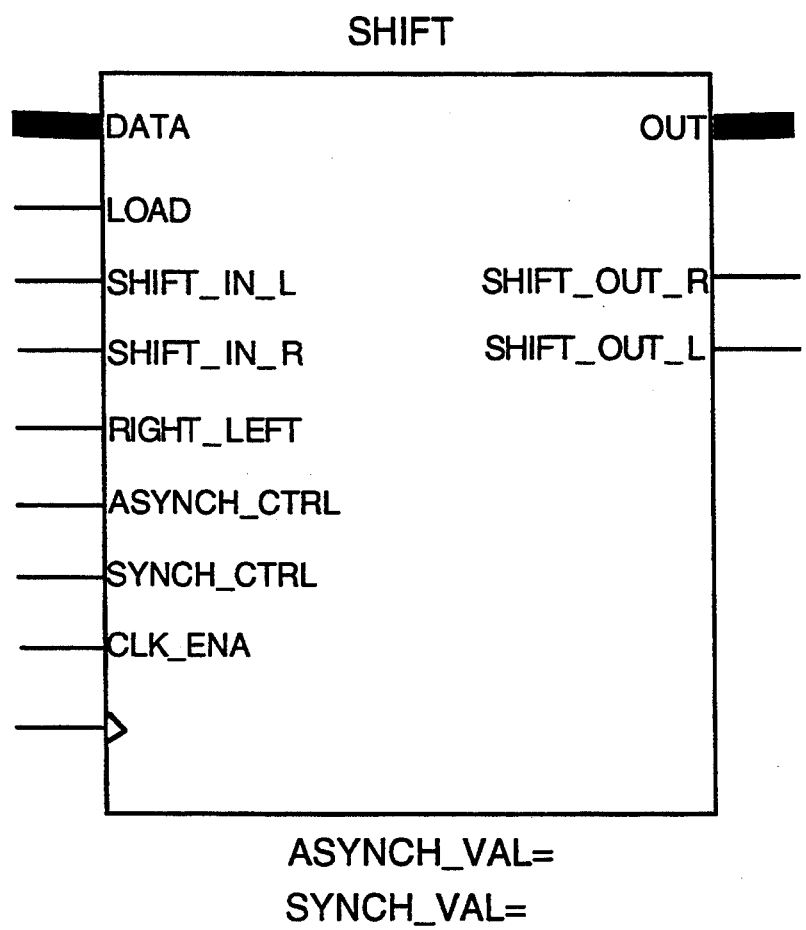
FIG. 5 shows a shift register symbol used with the method of the present invention.

FIG. 5 shows a shift register library symbol which also uses the method of the present invention. The symbol of FIG. 5 includes nodes for specifying whether data will shift left or right, for shifting data from the left and from the right, as well as the parallel DATA input node of the register symbol of FIG. 2. For output, the symbol includes a parallel output node labeled SHIFT, and left and right serial output nodes labeled SHIFT_OUT_R and SHIFT_OUT_L. This symbol also includes means for inputting parameters specifying synch and asynch reset values.

Figure 6:
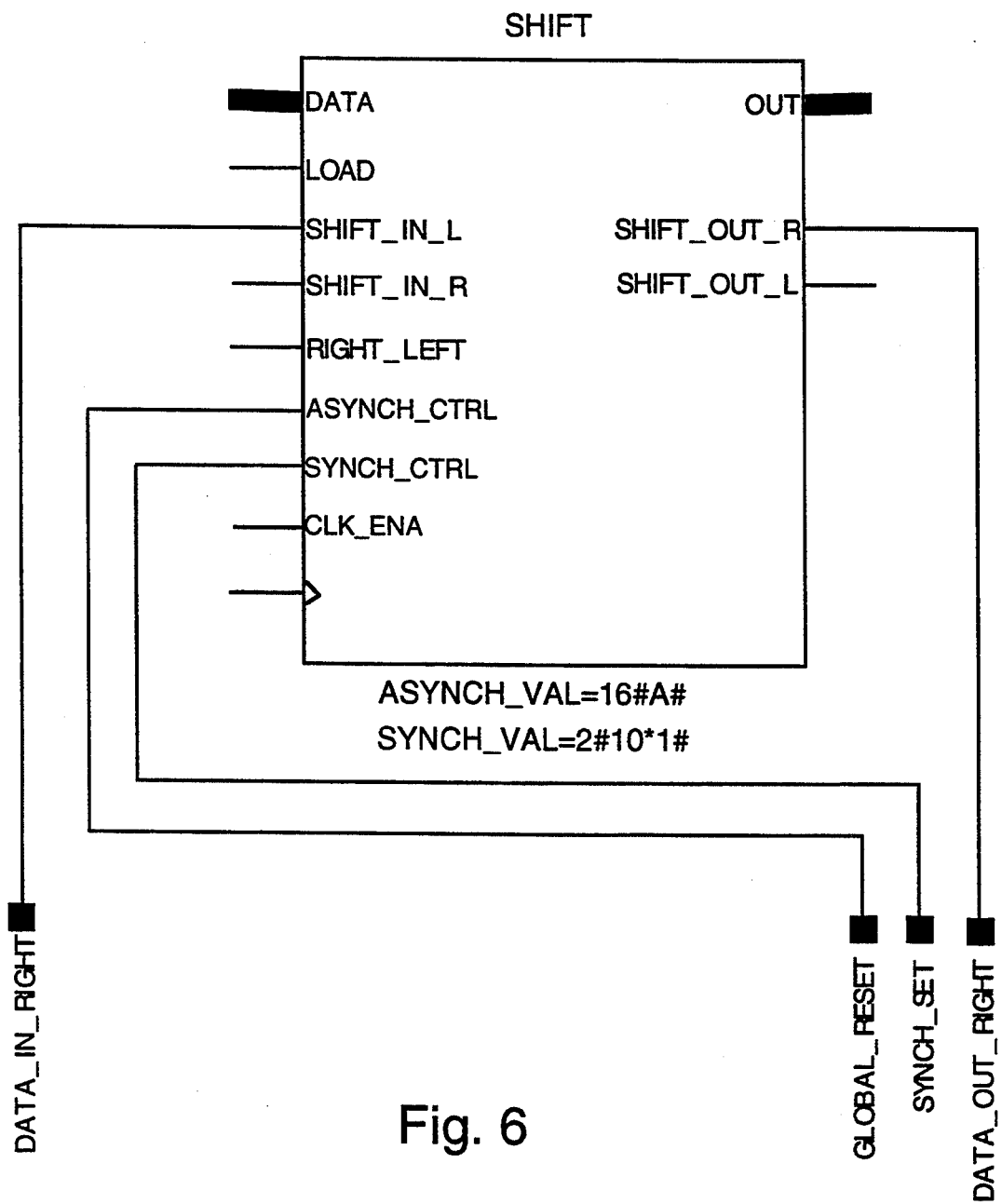
FIG. 6 shows an example use of the shift register symbol of FIG. 5.

FIG. 6 shows an example use of the symbol of FIG. 5 to form a four-bit register (the number of bits in the register is preferably entered by specifying bus width on the bus attached to the register, as discussed in related U.S. patent application Ser. No. 07/785,664 still pending. Connection of a line labeled DATA_IN_LEFT to the SHIFT_IN_L node of the symbol indicates the data will be serial and shifted in from the left. Connection of a line labeled DATA_OUT_RIGHT to the SHIFT_OUT_R node indicates output data will be shifted out serially to the right. SYNCH_CTRL and ASYNCH_CTRL signals are as discussed above in connection with FIG. 3. Note that not all nodes are connected. The method of the invention includes generating a corresponding circuit which only implements the portions of a function specified by the user. Thus the symbol of FIG. 6 can result in multiple circuits, as selected by the user.

Figure 7:
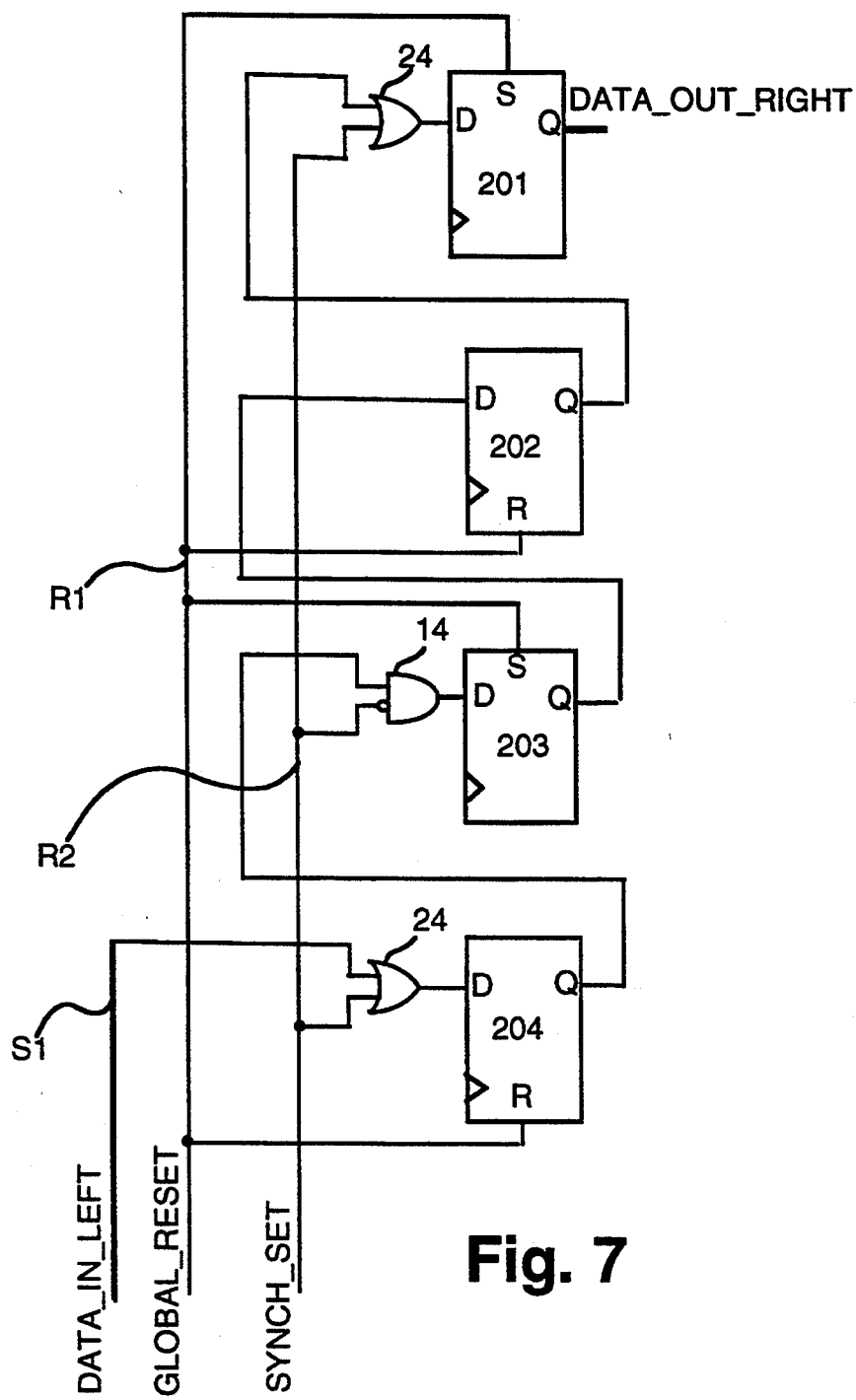
FIG. 7 shows the circuit which implements the shift register example of FIG. 6.

FIG. 7 shows a circuit generated in response to the symbol and parameters shown in FIG. 6. The D and Q terminals of flip flops 201 through 204 are connected to form a serial string of flip flops with a DATA_IN_LEFT shift-in signal on line S1 being provided to flip flop 204 and a DATA-OUT-RIGHT shift-out signal being taken from the Q output terminal of flip flop 201. It can be seen that asynchronous and synchronous control lines R1 and R2 are connected and function as described above in connection with FIG. 4. However, the symbol of FIG. 6 includes a * at the second-leastsignificant digit, indicating that the user doesn't care what value will be assigned to the bit in response to a synchronous reset signal. Since the second least-significant-bit is a *, the synchronous control logic implemented in FIG. 7 in response to the symbol of FIG. 6 does not affect the corresponding register 202.

Figure 8:
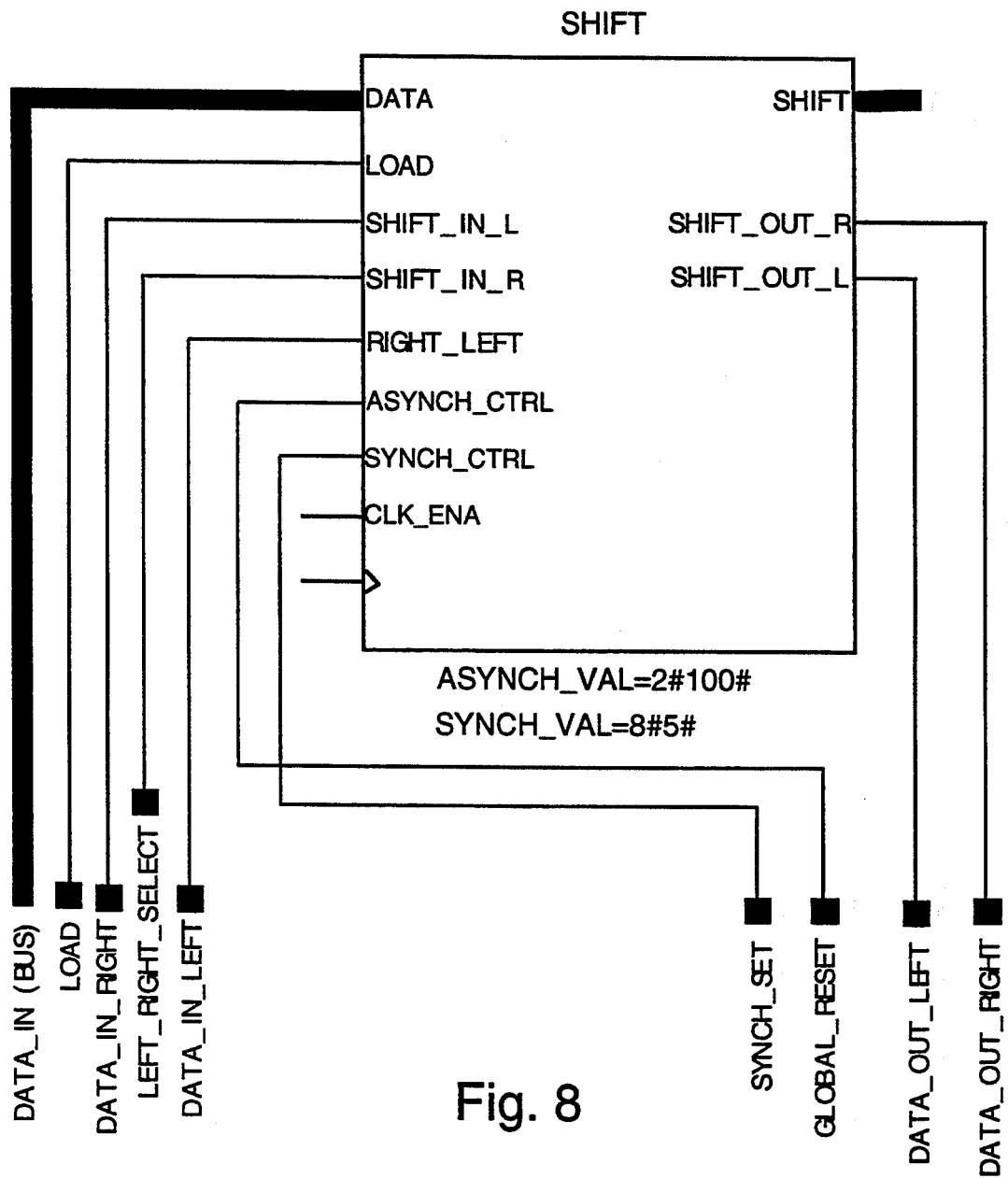
FIG. 8 shows an example use of the shift register symbol of FIG. 5.

FIG. 8 shows another use of the symbol of FIG. 5, this time to implement a three-bit register which is a parallel loadable, left/right shift register. On the symbol of FIG. 5, in addition to the ASYNCH_CTRL and SYNCH_CTRL nodes, the symbol includes a DATA input line for parallel loading of data, SHIFT_IN_L and SHIFT_IN_R nodes for shifting data in from the left or right respectively, SHIFT_OUT_L and SHIFT_OUT_R nodes for shifting data out from the left or right respectively, and a RIGHT_LEFT control node for controlling whether the data will shift in from left or right. Although a parallel output may alternatively be provided as indicated by the SHIFT output node, the parallel output is not utilized in this example.

Figure 9:
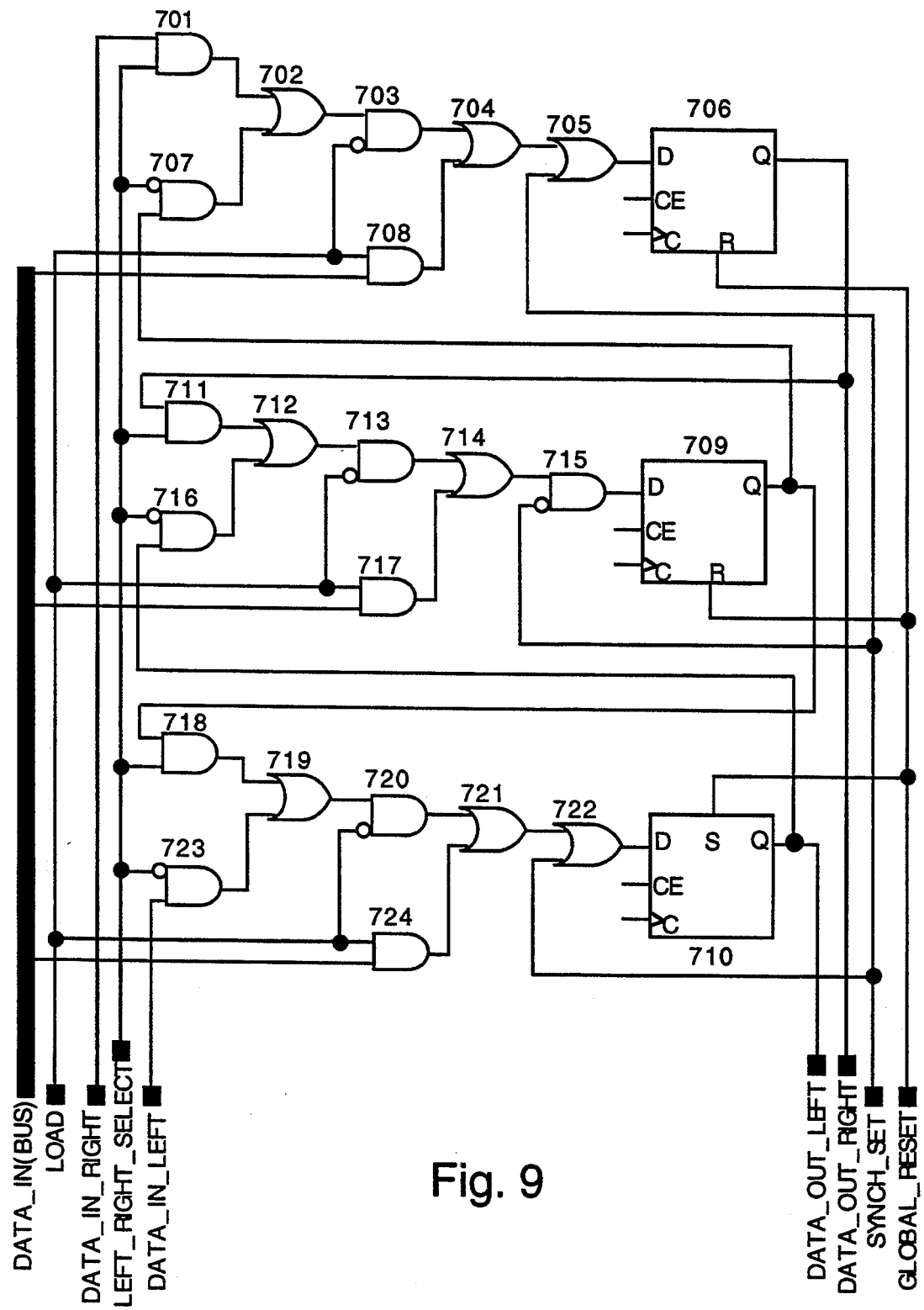
FIG. 9 shows a circuit which implements the shift register example of FIG. 8.

The circuit of FIG. 9 is formed automatically according to the present invention, in response to information provided by and with the symbol of FIG. 5 in combination with other information indicating bus width and connections to other parts of the block diagram. (Copending application Ser. No. 07/785,664 still pending indicates how bus width is entered in one preferred embodiment). Copending application Ser. No. 07/785,659 still pending indicates how other modules are generated in response to a logic design. The logic represented by logic gates 701-705 and 707-708 of FIG. 9 is generated in response to the user entering the symbol of FIG. 8, entering the connections to other elements in the block diagram, and entering parameters associated with the symbol. The circuit of FIG. 9 is then generated automatically. The circuit of FIG. 9 implements the register specified in FIG. 8 to be preloadable with a specified value, namely binary 100 in response to an asynchronous reset and 5 in base 8 (binary 101) in response to a synchronous reset. In addition the circuit of FIG. 9 provides means DATA_IN_LEFT for loading data from the left and means DATA_IN_RIGHT for loading data from the right, and control means LEFT_RIGHT_SELECT for selecting between these two means for loading. Also indicated in FIG. 8 and implemented in the circuit of FIG. 9 are means for shifting data out to the left or right, on lines labeled DATA_OUT_LEFT and DATA_OUT_RIGHT respectively. FIG. 9 does not include means for shifting data out in parallel, since the user did not specify in FIG. 8 a connection to the SHIFT output node of the register symbol.

In FIG. 9, synchronous and asynchronous set/reset lines are provided as specified in FIG. 8. The parameters of FIG. 8 establish the asynchronous and synchronous values as 4 (binary 100) and 5 (binary 101) respectively. In FIG. 9, OR gate 705 provides the synchronous reset control to flip flop 706 in the manner discussed earlier with respect to FIG. 4. Control for selecting between data in from the right and left is shown as implemented by the AND and OR gates at the left of FIG. 9. In particular, a logical 0 LEFT_RIGHT_SELECT signal causes AND-gates 707, 716, and 723 to pass the signal on the second node of each of those AND-gates. Thus, the output of AND-gate 707 will be the same as the output of flip-flop 709, the output of AND-gate 716 will be the same as the output from of flip-flop 710, and the output of AND-gate 723 will be the same as DATA_IN_LEFT. At the same time, AND-gates 701, 711 and 718 output a logic 0 due to LEFT_RIGHT_SELECT being low. The output of OR-gates 702, 712 and 719 is determined by the signals being passed through the AND-gates 707, 716 and 723. If the LEFT_RIGHT_SELECT is high, then the values will be shifted in the opposite direction.

A low LOAD signal allows the outputs of AND-gates 707, 716 and 723 to be passed through OR-gates 704, 714 and 721 to gates 705, 715 and 722 that control the contents of the flip-flops when the synchronous control signal is enabled. A high LOAD signal allows the data on the DATA_IN bus to pass through AND-gates 708, 717 and 724 to the synchronous control logic.

A high SYNCH_SET signal will force gates 705, 715 and 722 to the synchronous value (binary 100 in this example). A low SYNCH_SET will pass the values output from the OR-gates 704, 714 and 721 to registers 706, 709, and 710 at the next clock edge. A high GLOBAL_RESET signal will force flip flops 706, 709, and 710 to assume the binary value 101 immediately. Thus the circuit of FIG. 9 implements the instructions provided in the block diagram symbol of FIG. 8.

Figure 10:
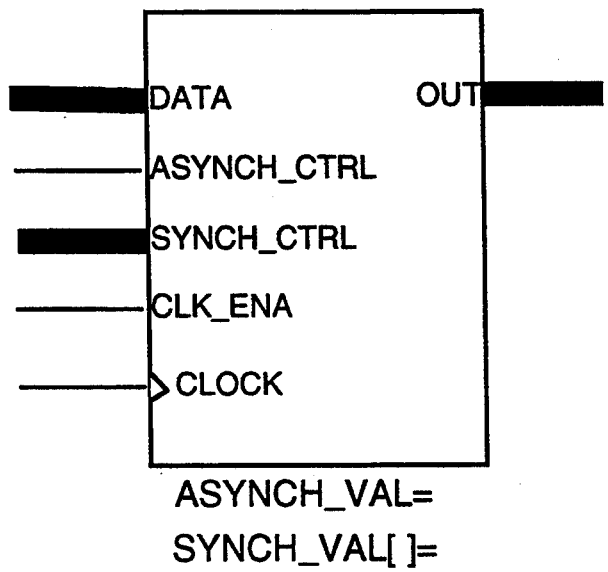
FIGS. 10 and 11 show another register symbol and its use for a 3-bit register in which selected reset parameters can be entered on the register symbol to implement selected portions of a reset value.
Figure 11:
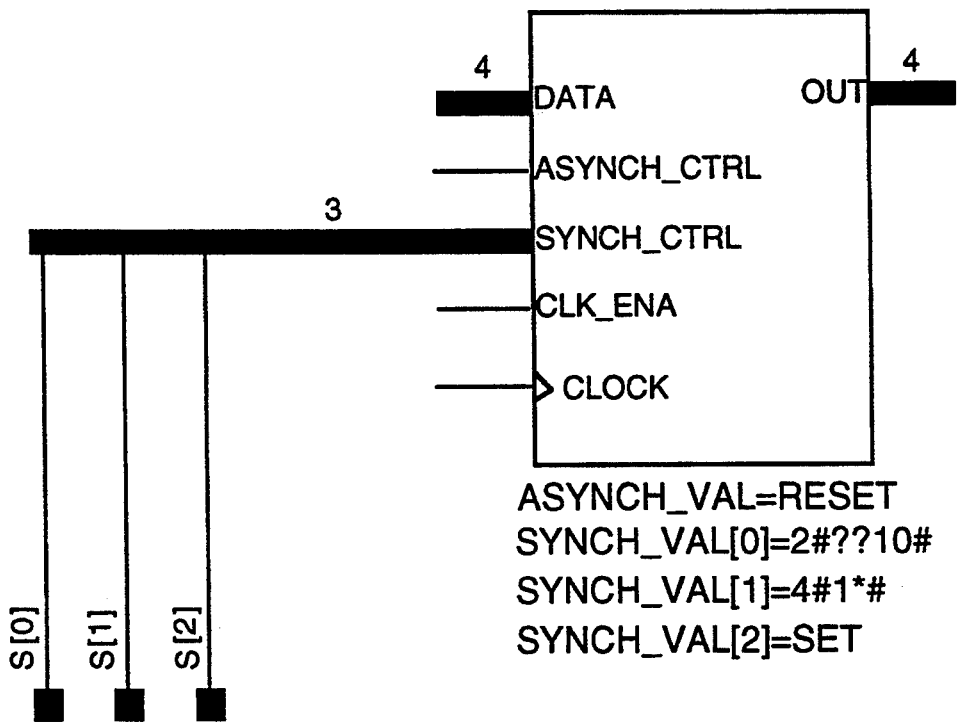
Figure 12:
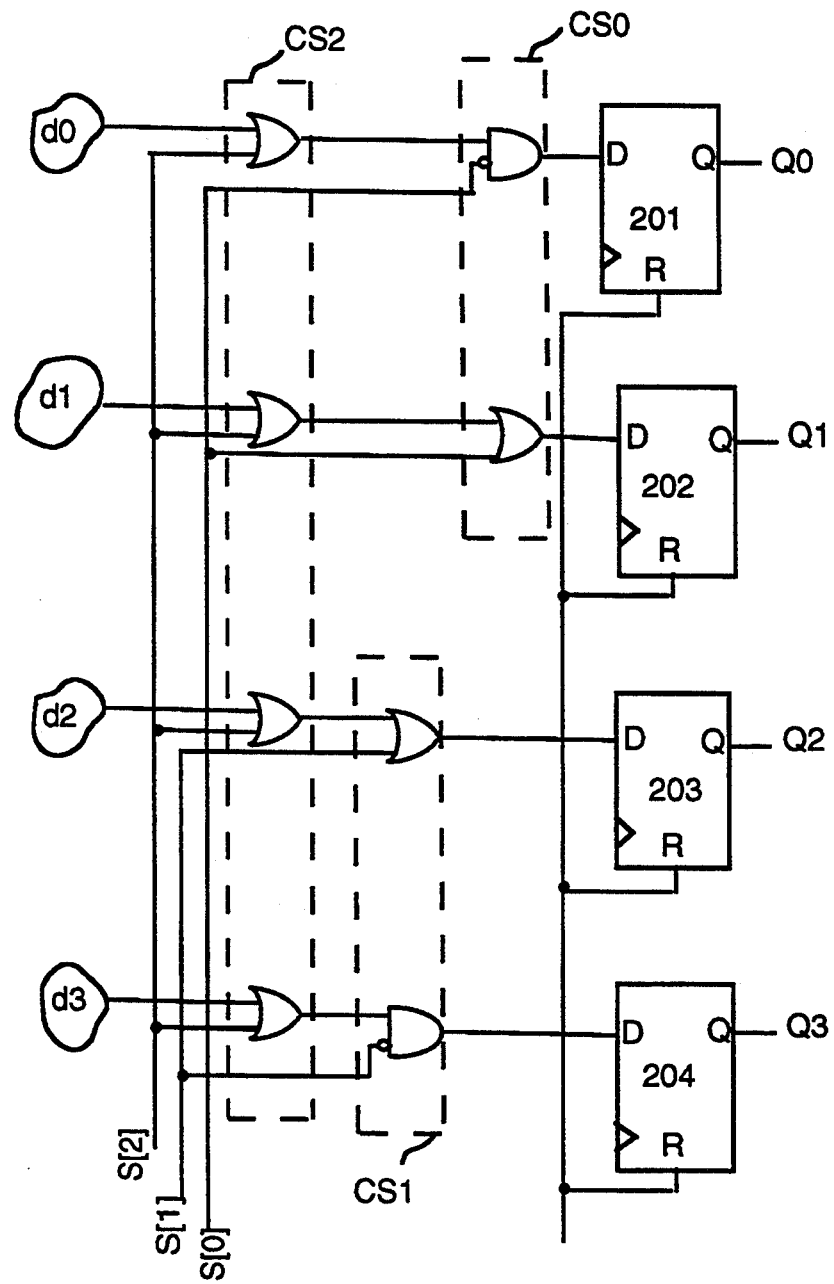
FIG. 12 shows the circuit automatically generated to respond to the symbol of FIG. 10.

FIG. 10 shows another register symbol which illustrates an additional feature of the invention. The symbol of FIG. 10 includes more than one synch control value and allows the user to provide conditions under which different reset values will be returned. On the symbol of FIG. 10, three synch values SYNCH_VAL [0], SYNCH_VAL [1], SYNCH_VAL [2] can be entered. These three synch values will cause the register circuit to return one of 8 output functions after the next clock pulse. FIG. 11 shows the corresponding symbol used with a 4-bit bus and a 3-bit SYNCH_CTRL bus. In addition to entering the value "RESET" on the ASYNCH_CTRL parameter, on the synchronous parameters, the user has entered the values SYNCH_VAL [0]=2#??10#, SYNCH_VAL [1]=4#1*#, and SYNCH_VAL [2]=SET. The user has not connected a line to the ASYNCH_CTRL node, so the on-chip global reset line which is available in a preferred embodiment will be used for asynchronous reset. The synchronous control values entered by the user specify that a circuit will be constructed with three stages of control. FIG. 12 shows the resulting circuit constructed in response to the symbol of FIG. 11. As shown in FIG. 12, the parameter attached to SYNCH_VAL[0], which is 2#??10# (meaning the binary number ??10) includes two don't-care bits in the two most significant digits. No additional logic is provided for a don't care bit. However, when several synchronous stages are specified, a bit which is indicated as a don't care bit for one stage may still be synchronously controlled at another stage.

As can be seen in FIG. 12, the output of ??10 is achieved by sending a three-digit synchronous reset value of 001 on the synchronous reset lines S[2], S[1], and S[0] respectively. This combination of reset signals produces an output value of d3, d2, 1, and 0 on the four output nodes Q3, Q2, Q1, and Q0 respectively. The response specified by SYNCH_VAL [1] is achieved by sending 010 on the synchronous reset lines S[2], S[1], and S[0] respectively. Likewise, the SYNCH_VAL [2] of "SET" or all 1's is achieved by sending 100 on the three synchronous reset lines S[2], S[1], and S[0] respectively. Additional combinations are achieved by sending other combinations on the synchronous reset lines. FIG. 13 shows the corresponding truth table which results from applying each combination of signals on three synchronous control lines.

Figure 14:
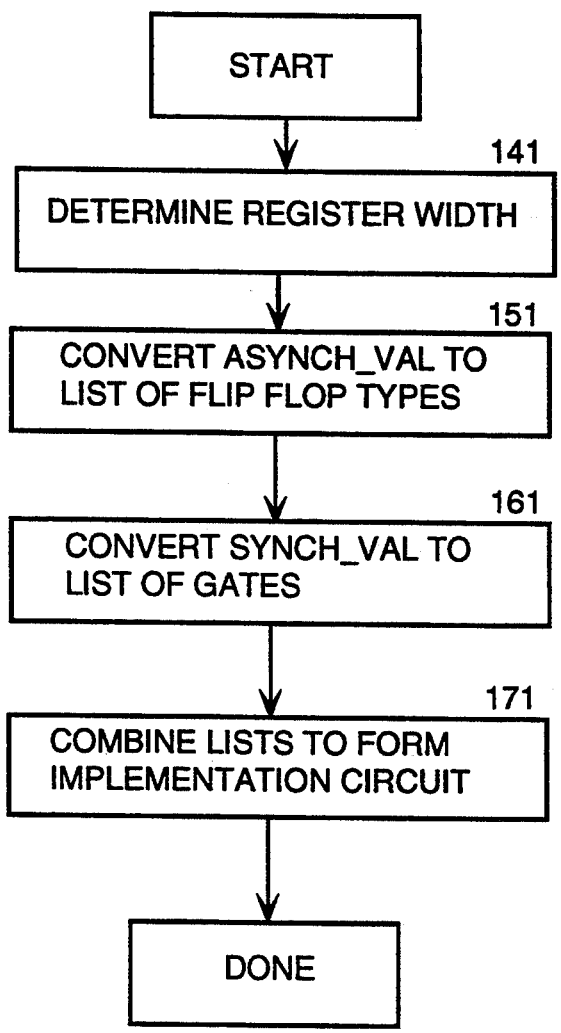
FIG. 14. is a block diagram describing steps carried out in implementing steps of the present invention.

One method for converting from the symbols such as shown in FIGS. 2, 5, and 10 to circuits such as shown in FIGS. 4, 7, and 12 involves the steps shown in FIG. 14. In a preferred embodiment, four major steps occur. First as shown in step 141, the width of the register (number of bits) is determined, preferably by reading a file generated by the Data-Type Propagation algorithm discussed in application Ser. No. 07/785,664 still pending. This width value establishes a number of flip flops to insert into the circuit. For example, in FIGS. 3 and 6, the bus width was specified at 4, so four flip flops will be provided in the circuit.

Second, as shown in step 151, the parameter entered by the user adjacent the ASYNCH_VAL symbol (see FIGS. 3, 6, or 11) is read to determine a list of flip flop types. For example, in FIGS. 3 and 6, the ASYNCH_VAL parameter is 16#A#, which is binary 1010. Thus, the four flip flops 201-204 of FIG. 4 will be S, R, S, and R respectively.

Next, as shown in step 161, the SYNCH_VAL entries are converted to a list of gates. For example in FIG. 4, the SYNCH_VAL entry of 10#13# (which is binary 1101) calls for OR, OR, bubbled-AND, and OR feeding the D inputs of flip flops 201-204 respectively. Alternatively, in FIG. 6, the SYNCH_VAL input of 2#10*1# (binary 10?1) includes a don't care entry, and results in no gate for providing a control from the SYNCH_SET line to the D input of flip flop 202. A similar reading produces three lists of gates for the control units CS0, CS1, and CS2 shown in FIG. 12.

Finally, as indicated in step 171, the flip flop types generated in step 151 and the gates list generated in step 161 are combined to generate the circuit diagram of FIG. 12. As can be seen in FIG. 12, the plural SYNCH_VAL entries are handled in a hierarchy with SYNCH_VAL [0] receiving output from SYNCH_VAL [1] which receives output from SYNCH_VAL [2]. Although FIG. 12 shows a presently preferred embodiment, it is by no means the only embodiment.

Figure 15:
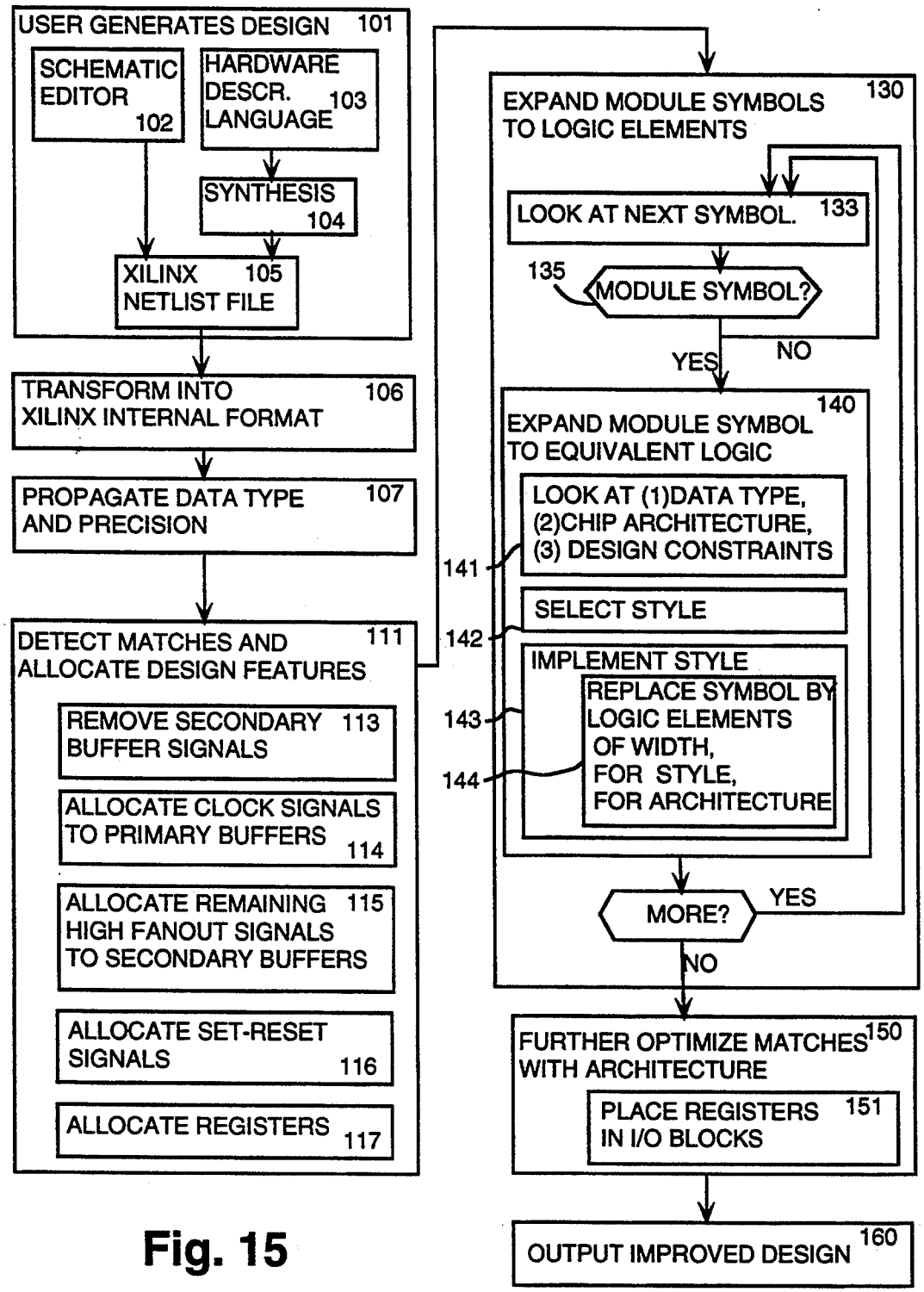
FIG. 15 shows the general flow of a method for configuring array chips from information provided in high level block diagrams, and includes steps of the present invention.

FIG. 15 shows the general flow of a method for configuring logic array chips from information provided in high level block diagrams. The steps of FIG. 15 are discussed in the three related applications mentioned above and incorporated by reference. The present invention relates particularly to step 116 of FIG. 15.

Many other embodiments of the invention will become obvious to those skilled in the art in light of the above description. These other embodiments are intended to fall within the scope of the present invention.

We claim:

1. A set/reset function generator comprising:
   a symbol library including at least one symbol representing a function which can be synchronously and asynchronously controlled, said symbol including at least one position for entering a set/reset parameter to further define said symbol;
   means for selecting said at least one symbol from said symbol library;
   means for allowing a user to enter said set/reset parameter at said at least one position to further define said symbol; and
   means for configuring a logic device to provide a set/reset function associated with said symbol in response to said symbol and said set/reset parameter.

2. A set/reset function generator as in claim 1 further comprising:
   means for reading and displaying said set/reset parameter.

3. A set/reset function generator as in claim 1 further comprising:
   means for reading indications of conductive lines connected to said symbol; and
   means for configuring a logic device to implement said conductive lines.

4. A set/reset function generator as in claim 1 in which said parameter defines an initial power-up state, and
   said means for configuring causes said logic device to power up to a selected state in response to said symbol and said parameter.

5. A set/reset function generator as in claim 1 further including
   means for reading said set/reset parameter.

6. A set/reset function generator as in claim 5 in which said symbol includes positions for entering an asynchronous set/reset parameter and a synchronous set/reset parameter; and said means for reading said set/reset parameter comprises means for reading both synchronous and asynchronous set/reset parameters.

7. A set/reset function generator as in claim 1 in which said means for reading said synchronous set/reset parameter comprises means for reading a plurality of synchronous set/reset parameters.

8. A set/reset function generator as in claim 7 in which said plurality of synchronous set/reset parameters are implemented in a priority order.

9. A set/reset function generator as in claim 1 in which said means for configuring causes said logic device to implement only portions of a parameter not indicated as "don't-care".

10. A set/reset function generator as in claim 1 in which said at least one symbol includes a register symbol.

11. A set/reset function generator as in claim 1 in which said at least one symbol includes a shift register symbol.

12. A set/reset function generator as in claim 1 in which said at least one symbol includes an accumulator symbol.

13. A set/reset function generator as in claim 1 in which said at least one symbol includes a counter symbol.

14. A set/reset function generator as in claim 1 in which said at least one symbol includes a clock divider symbol.

* * * * *

UNITED STATES PATENT AND TRADEMARK OFFICE
CERTIFICATE OF CORRECTION

PATENT NO. : 5,337,255
DATED : August 9, 1994
INVENTOR(S) : Jorge P. Seidel, et. al.

It is certified that error appears in the above-indentified patent and that said Letters Patent is hereby corrected as shown below:

Col. 6, line 45, "ing." should read --ing).--.

Claim 7, col. 10, line 35, "claim 1" should read --claim 6--.

Signed and Sealed this

Nineteenth Day of September, 1995

BRUCE LEHMAN

Attest:

Attesting Officer

Commissioner of Patents and Trademarks